United States Patent [19]

Koyama

[11] Patent Number: 4,583,189

[45] Date of Patent: Apr. 15, 1986

[54] MICROPROCESSOR-BASED SCAN-MODE KEYING CIRCUIT

[75] Inventor: Tsuneyuki Koyama, Yokohama, Japan

[73] Assignee: Victor Company of Japan, Limited, Yokohama, Japan

[21] Appl. No.: 500,869

[22] Filed: Jun. 3, 1983

[30] Foreign Application Priority Data

Jun. 7, 1982 [JP] Japan .................................. 57-97324

[51] Int. Cl.$^4$ ...................... G06F 3/023; H01H 13/70; H03K 17/94
[52] U.S. Cl. ............................. 364/709; 340/365 S
[58] Field of Search ........ 364/189, 709, 200 MS File, 364/900 MS File; 340/365 S

[56] References Cited

U.S. PATENT DOCUMENTS

| | | |
|---|---|---|
| 3,668,659 | 6/1972 | Hutchings . |
| 3,803,592 | 4/1974 | Hatley ............................. 340/365 S |
| 3,806,912 | 4/1974 | Eckert . |
| 3,908,100 | 9/1975 | Richard et al. .................. 200/302.2 |
| 4,015,254 | 3/1977 | Strandt ............................ 340/365 S |
| 4,187,550 | 2/1980 | Garcia Ramos .................... 364/189 |
| 4,319,078 | 3/1982 | Yokoo et al. ..................... 340/365 S |
| 4,420,669 | 12/1983 | Scalf et al. ...................... 340/365 S |
| 4,429,301 | 1/1984 | Crumley et al. .................. 340/365 S |

FOREIGN PATENT DOCUMENTS 3017827  12/1980  Fed. Rep. of Germany .

OTHER PUBLICATIONS

Information Processing 71, Proceedings of the International Federation for Information Processing, Ljubljana, 1971, pp. 737-741, North Holland Publishing Company, 1972, Amsterdam, NL; P. J. Pobgee et al.: "Applications of a Low Cost Graphical Input Tablet". Patents Abstracts of Japan, vol. 7, No. 138(P-204)(1283), 16 Juin 1983; & JP-A-58 52729 (EPUSON K.K.) 29-03-1983.

Primary Examiner—James D. Thomas
Assistant Examiner—Dale M. Shaw
Attorney, Agent, or Firm—Cushman, Darby & Cushman

[57] ABSTRACT

A scan mode keying circuit comprises a voltage divider having a plurality of series-connected resistors with taps therebetween to develop a plurality of graduated voltages at the taps. A comparator having first and second input terminals is provided for generating a coincidence output when a match occurs between voltages applied to the input terminals. Plural of manually operated keys are connected to the taps for selectively applying the graduated voltages to the comparator first input terminal. A control circuit generates and applies a series of recyclic waveforms of time-varying reference voltage to the comparator second input terminal. Responsive to the coincidence output a datum representing the instantaneous value of the reference voltage is stored into a memory and compared with subsequently generated datum to verify that one of the key has been operated when a match occurs therebetween. If they fail to match, the control circuit proceeds to detect when the most recent datum is greater than the previous datum to verify that the operated key has been turned off.

4 Claims, 5 Drawing Figures

MICROPROCESSOR-BASED SCAN-MODE KEYING CIRCUIT

BACKGROUND OF THE INVENTION

The present invention relates to a keying circuit for identifying each of manually operated keys and detecting their operating states, and has for its object the provision of such a keying circuit which scans an array of key switches to identify the operated key by comparing a key identifying voltage with a variable reference represented by a datum stored in memory. In particular, the circuit eliminates disadvantages arising from key identifying voltages having indefinite amplitudes which are generated by the gradually increasing contact resistance at the instant the key switch is released into a turn-off state.

A known microprocessor-based keying circuit includes a voltage divider having a plurality of series-connected resistors with taps between successive resistors. An array of manually operated non-locked key switches are connected respectively to the taps to provide a plurality of graduated voltages respectively indentifying the particular functions of the key switches. When any one of the key switches is operated, a corresponding key identifying voltage is applied to the noninverting input of a comparator whose inverting input is supplied with a reference voltage of staircase waveform which is recyclically generated under the control of a microcomputer. When the two input voltages match, the comparator generates a coincidence signal and enables the microcomputer to store a datum representing the instantaneous value of the reference staircase voltage that occurred at the instant of the match into a memory. The same process is repeated to count the number of occurrences of match between the two input voltages. When this count value reaches a predetermined value the microcomputer verifies it as a valid indication that a key has been operated into a turn-on state and provides a corresponding mode selecting signal to a video recorder or the like to operate it in a mode specified by that key.

The keying circuit of this type is known as a scan mode discriminator because the time-varying reference voltage is used to sequentially scan the voltage level of the signal given by the operated key. The key scanning operation continues during turn-on periods so that at the instant the key is released the microcomputer detects a change in voltage supplied from the key array.

This type of keying circuit is advantageous for applications where the key array is mounted as a separate unit in a location remote from the circuit that identifies the key functions because it requires a small number of wires interconnecting the separated units. However, a disadvantage arises from the fact that a voltage of indefinite amplitude is likely to develop across the contact resistance of the key being turned off if it remains in an ambiguous position between turn-on and turned-off states. It is therefore highly likely that the microcomputer falsely identifies the indefinite voltage as an indication of the operation of a different key and generates a false mode selecting signal.

SUMMARY OF THE INVENTION

The present invention contemplates to identify an indefinite voltage level as an indication of a turn-off state by detecting when the most recent instantaneous value of the time-varying reference voltage becomes greater than the previous instantaneous value.

According to the present invention, the keying circuit comprises a voltage divider having a plurality of series-connected resistors with taps therebetween to develop a plurality of graduated voltages at the taps, a comparator having first and second input terminals for generating a coincidence output when a match occurs between two input voltages applied to the first and second input terminals thereof. A plurality of manually operated key switches are connected to the taps for selectively applying the graduated voltages to the first input terminal of the comparator in response to the operation of a said key switch. A control circuit generates and applies a series of recyclic waveforms of time-varying reference voltage to the second input terminal of the comparator and responsive to the occurrence of the coincidence output stores a datum representing the instantaneous value of the time-varying reference voltage into a memory. The control circuit detects a match between the datum that represents the instantaneous value of a subsequently generated time-varying reference voltage and the datum that is stored in the memory and verifies that one of the key switch has been operated. The above process is continued to monitor a change in voltage at the comparator's first input terminal to detect the instant the key is turned off. The control circuit verifies this turn-off condition by detecting when the most recent datum becomes greater than the previously stored datum.

BRIEF DESCRIPTION OF THE DRAWINGS

The present invention will be described in further detail with reference to the accompanying drawings, in which.

DETAILED DESCRIPTION

Figure 1:
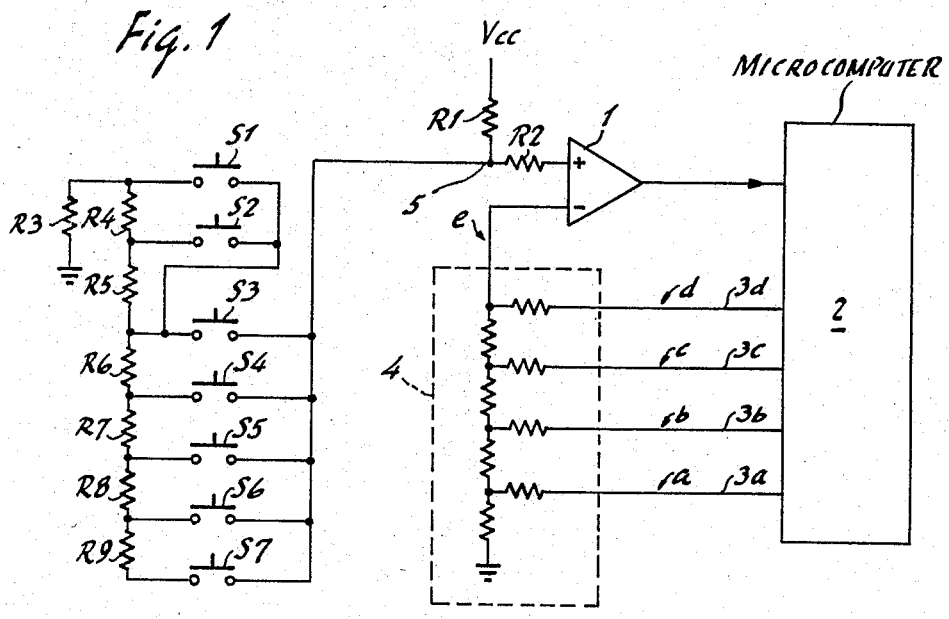
FIG. 1 is a circuit diagram of a keying circuit embodying the present invention.

Referring now to FIG. 1, there is shown a microproccessor-based scan mode keying circuit embodying the present invention. An array of manually operated keys S1 to S7 of non-locked type are connected respectively at their first terminals to tapped points of a voltage divider having a series of resistors R3 to R9 connected at one end to ground. Specifically, the key array is provided for use in a video tape recorder in which the keys S1 and S2 have their second terminals connected together to the first terminal of the key S3, while the second terminals of the keys S3 to S7 are coupled together to a junction 5 between resistors R1 and R2. Keys S1 and S2 have special functions which are only effective when key S3 is operated.

A voltage comparator 1 has a noninverting input terminal coupled through resistor R2 to the junction 5. When all the keys remains in turn-off state, the voltage developed at the junction 5 is determined by a voltage coupled through rsistor R1 from a voltage supply at Vcc. To the inverting input of the comparator 1 is applied a reference voltage of a series of staircase waveforms from a digital-to-analog converter 4 of a ladder type. When the two inputs of the comparator 1 match, a coincidence signal is applied from the comparator to a microcomputer 2. The microcomputer 2 is any of conventional designs having a microprocessor, a read-only memory, a random access memory and a number of counters and registers, all of which are omitted for the sake of simplicity since the subject matter of the invention is not concerned with the hardware structure of the microcomputer.

Figure 2:
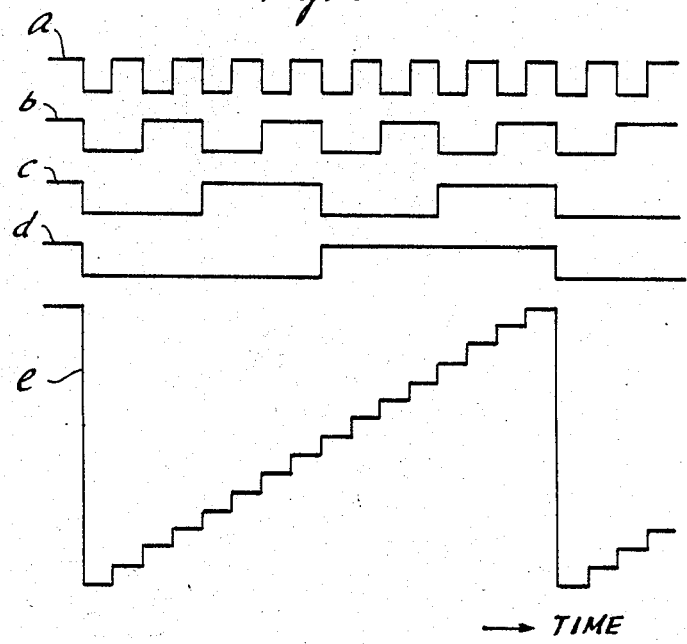
FIG. 2 is a waveform diagram of a plurality of pulse trains and a reference staircase voltage derived from the pulse trains.

As will be described later in more detail, the microcomputer 2 is preprogrammed to execute the programmed instructions to generate a series of reference data which is translated into a plurality of pulse trains of different frequencies as indicated by waveforms a, b, c and d, in FIG. 2 and applied to terminals $3a$ to $3d$ and thence to the respective taps of the ladder network of resistors 4 where the pulses are combined to generate a staircase voltage shown at e in FIG. 2. The highest value of this staircase voltage $e_{max}$ is slightly lower than the supply voltage Vcc but slightly higher than the voltage which would be generated in response to the operation of key switch S7.

When any one of the keys S1 to S7 is operated, a voltage identifying that key is applied to the noninverting input of the comparator 1 and compared in succession with each one of the varying step voltages. When the compared voltages match, the comparator 1 sends a pulse to the microcomputer 2 to enable it to store the reference datum that occurred at the time of the match into a memory.

Figure 3:
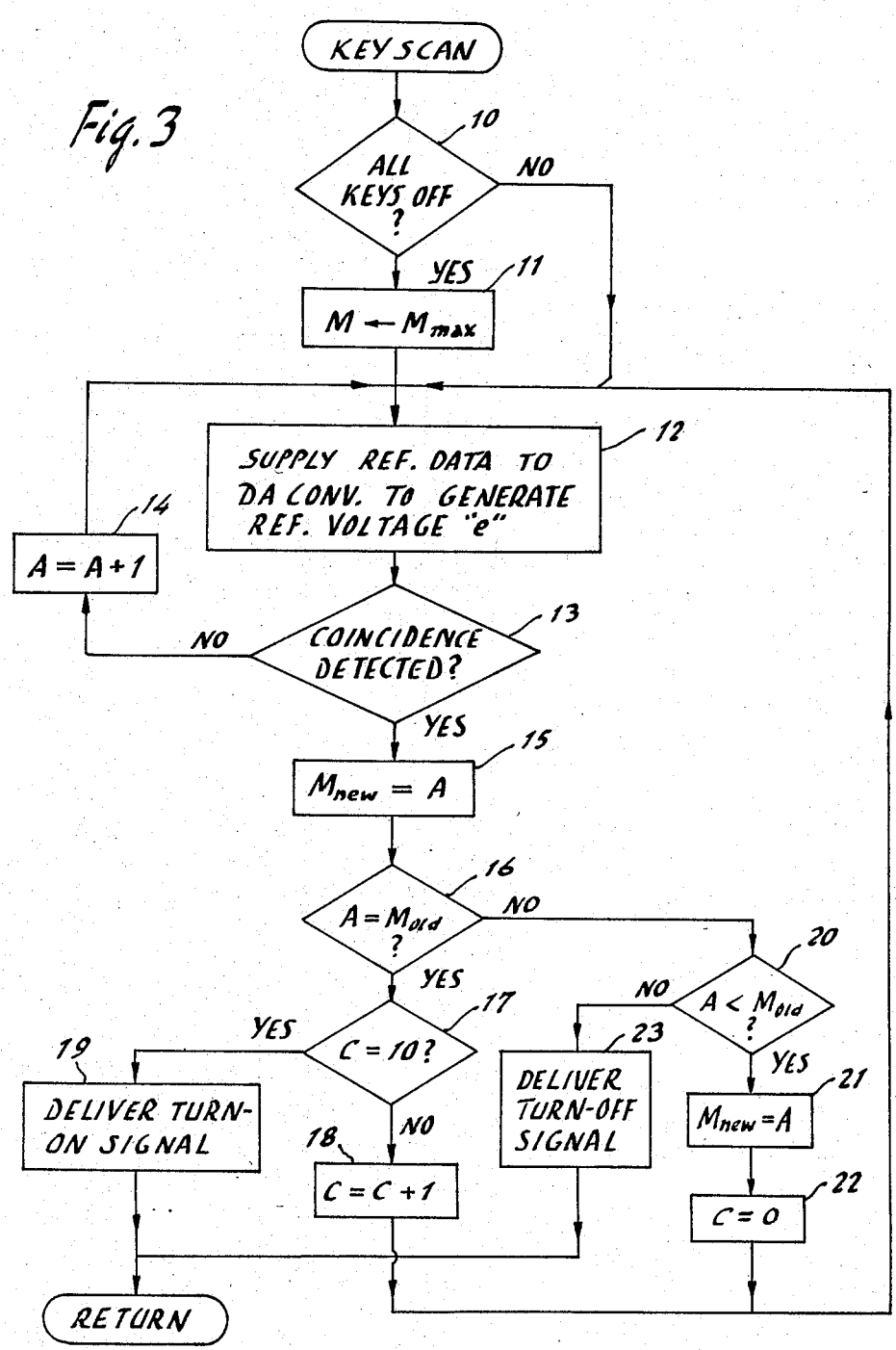
FIG. 3 is a flowchart describing progammed instructions performed by the microcomputer of FIG. 1 according to an embodiment of the invention.

A more specific description of the operation of microcomputer 2 is given with reference to a flowchart shown in FIG. 3.

In FIG. 3, program execution starts at a Step shown in a block 10. In this step the microprocessor applies pulses to terminals $3a$ to $3d$ that correspond to the highest value $e_{max}$ of staircase voltage to check if all the keys are in a turn-off state. If so, the comparator 1 generates a low-level voltage and the microprocessor detects it as an indication of an all-key-off state and advances to a Step 11, and if not, goes to a Step 12. In the Step 11, a memory location is addressed to store a datum representing a given voltage which is higher than any of the key identifying voltages. In Step 12, the microprocessor generates a datum R corresponding to a step voltage e of the staircase reference which is applied in the form of pulses mentioned above to the digital-to-analog converter 4 and goes to a Step 13 to check if a coincidence signal is generated by the comparator 1. If no coincidence occurs, a Step 14 will be executed to increment a reference step counter A by "1" to return to the Step 12 to increment the reference step voltage by a unit value. If coincidence is detected, the microprocessor stores the reference step value A into a new memory location Mnew at Step 15.

In a Step 16, a comparison is made between the value A and the previous A value now stored in old memory location Mold. If the key remains operated, a check is made in a Step 17 to see if the coincidence has occurred repeatedly ten times, and if not, a coincidence counter C is incremented by "1" in a Step 18 and the program execution returns to the Step 12 to repeat the above process. If the match occurs ten times, the microprocessor recognizes it as a valid indication that a key has been operated into a turn-on state and delivers a mode select signal to a circuit specified by the A value representing the particular function of the operated key (Step 19).

If no match occurs in the Step 16, the microprocessor exits to a Step 20 to check if the A value is smaller than the previous A value, and if so the memory Mnew is updated with the value A in Step 21 and the coincidence counter C is reset in Step 22 before execution returns to Step 12. If the A value is greater than the previous value, a Step 23 is executed to deliver a turn-off signal or remove the mode select signal.

Figure 4:
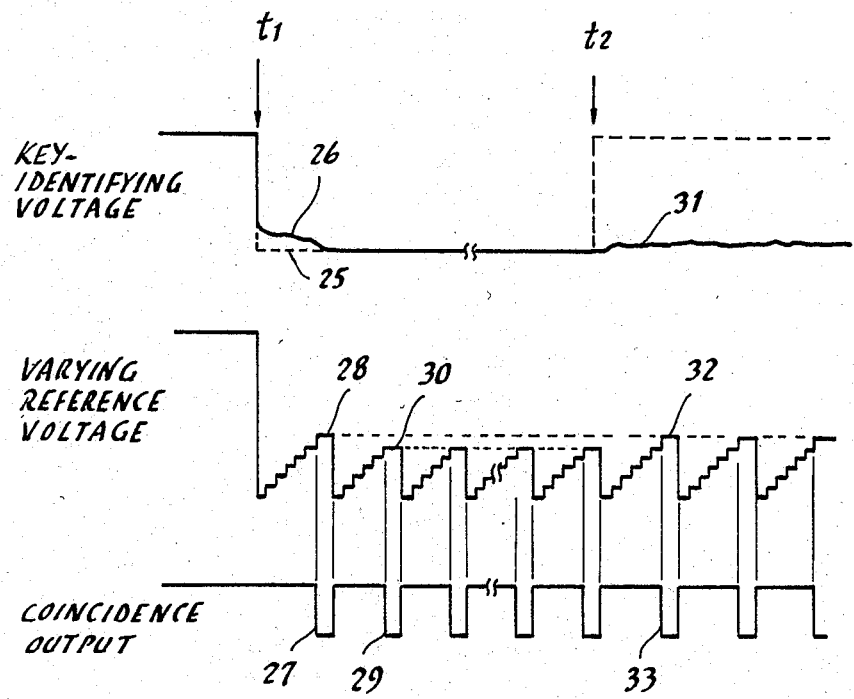
FIG. 4 is a waveform diagram useful for describing the operation of the invention.

The operation of the invention will be visualized with reference to a timing diagram shown in FIG. 4.

Assume that the key S3 is operated at time $t_1$ causing the voltage at the noninverting input of comparator 1 to rapidly drop from the source voltage Vcc to a voltage which is a fraction of Vcc determined by the ratio $(R3+R4+R5)/(R1+R3+R4+R5)$. Due to the inherent contact resistance of key S3, the voltage does not drop rapidly to the calculated level indicated by a broken line 25 and follows a waveform 26 indicated by a solid line so that it stays briefly at a level which corresponds to a level which would be given by the key S4. Therefore, a first coincidence pulse 27 occurs at the instant a reference voltage 28 reaches a discrete level 6. The voltage gradually reduces and reaches the calculated value. A second coincidence pulse 29 occurs when a subsequent reference voltage 30 reaches a level 5. If the voltage stays at the calculated value, the maximum value of reference voltages that occur during subsequent interval stays at the level 5 and the coincidence counter C is eventually incremented to a value 10 that enables the microprocessor to generate a turn-on signal at Step 19.

If the key switch S3 is released at time $t_2$, the voltage at the noninverting input of comparator 1 would normally rise rapidly to the high, turn-off level as indicated at $31a$. However, if the finger remains briefly on the key S3 so that it assumes a position between the turn-on and turn-off states, the contact resistance of that key S3 increases and as a result a voltage of indefinite amplitude as indicated at 31 is generated at the noninverting input of comparator 1. This voltage 31 would correspond to a level which would be derived as if key S4 were operated. A reference voltage 32 having a step level 6 is thus generated in response to a coincidence pulse 33 and the microprocessor exits from Step 16 to Step 20.

According to the prior art keying circuit, the microprocessor would exit from Step 16 directly to Step 21 and update the memory with a datum corresponding to the indefinite voltage value and loop around Steps 12 through 18, and recognize the new state as an indication that key S4 has been operated and issue a false command signal.

However, due to the provision of Steps 20 and 23, the voltage change from the minimum level 25 to the indefinite level 31 enables the microprocessor to divert from the key scan loop allowing to generate a valid turn-off signal.

Figure 5:
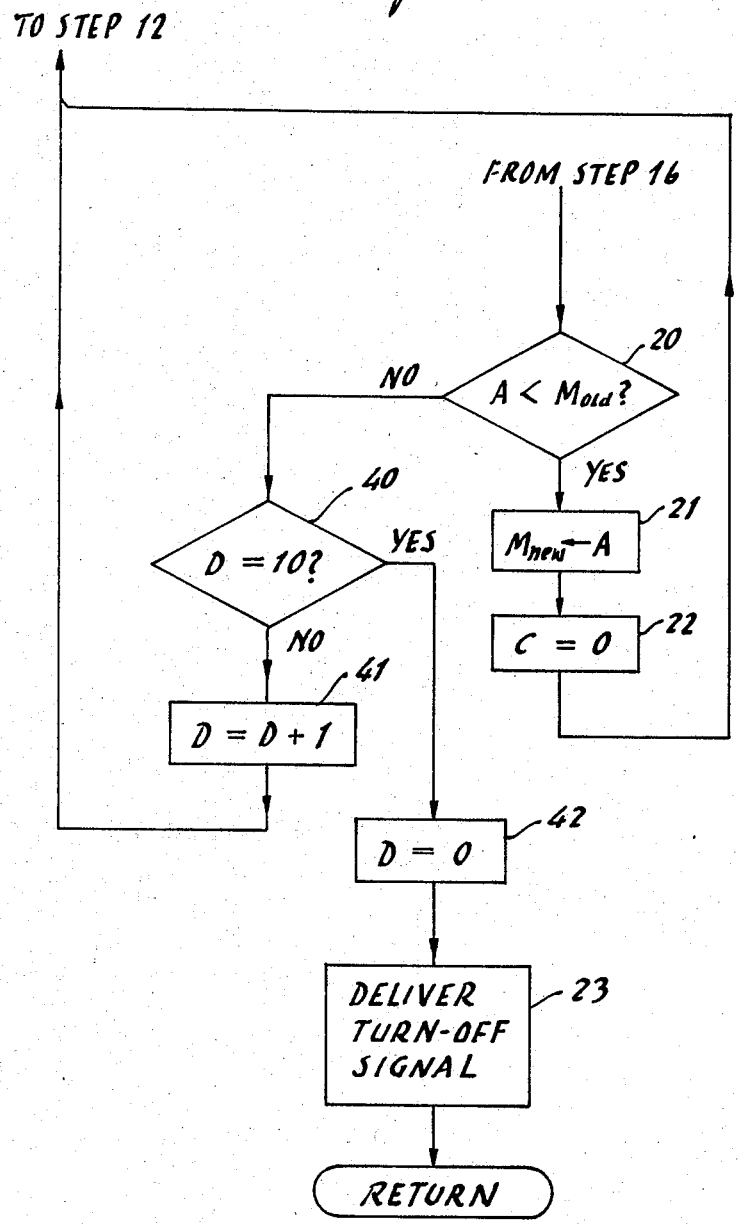
FIG. 5 is a flowchart describing programmed instructions of the microcomputer according to a modified embodiment.

FIG. 5 is a modification of the flowchart of FIG. 3. This flowchart additionally includes Steps 40 to 42 to repeat the Step 20 to ensure that the indefinite voltage is present for a certain period of time. Specifically, after making a "No" decision at Step 20, the microcomputer goes through Steps 40 and 41 by checking the count value in a second coincidence counter D and incrementing it by "1" and returning to Step 12. If the indefinite voltage continues the program execution arrives at Step 20 again and repeats the Steps 40 and 41. When D=10 is detected in Step 40, the coincidence counter D is reset to zero in Step 42 prior to the execution of Step 23.

What is claimed is:

1. A keying circuit comprising:
   a voltage divider having a plurality of series-connected resistors with taps therebetween to develop a plurality of graduated voltages at said taps;
   a comparator having first and second input terminals for generating a coincidence output when a match occurs between voltages applied respectively to said first and second input terminals;
   a plurality of manually operated key switches connected to said taps for selectively applying said graduated voltages to said first input terminal in response to operation of a said key switch; and
   control means for generating and applying a series of recyclic waveforms of time-varying reference voltage to said second input terminal and responsive to the occurrence of said coincidence output for storing a datum representing the instantaneous value of said time-varying reference voltage into a memory, detecting multiple occurrences of identical value between the datum representing the instantaneous value of a subsequently generated time-varying reference voltage and the datum stored in said memory to verify that one of said key switches has been operated, and detecting when the last-mentioned instantaneous value is greater than the last-mentioned stored datum to verify that said operated key switch has been turned off.

2. A keying circuit as claimed in claim 1, wherein said time-varying reference voltage is a series of recyclically occurring staircase waveforms.

3. A keying circuit as claimed in claim 1, wherein said control means comprises a digital-to-analog converting means having an output connected to said second input terminal of said comparator and a microcomputer which is programmed to execute the following steps:
   (a) generating a reference datum representing the instantaneous value of a staircase voltage and applying said datum to the input of said converting means to cause same to generate a said instantaneous value;
   (b) detecting said coincidence output from said comparator;
   (c) if said coincidence output is not detected, repeating the steps (a) and (b);
   (d) if said coincidence output is detected, storing a datum representing said instantaneous value into a different location of said memory;
   (e) detecting a match between the datum most recently stored in said memory and the datum previously stored in said memory;
   (f) if said match is detected, detecting if the number of occurrences of said match reaches a predetermined number to verify that one of said key switches has been turned on and detecting if said predetermined number is not reached and returning to the step (a); and
   (g) if said match is not detected, detecting when said most recently stored datum is greater than said previously stored datum to verify that that said operated key has been turned off, and detecting when said most recently stored datum is smaller than said previously stored datum and returning to the step (a).

4. A keying circuit as claimed in claim 3, wherein the step (g) further comprises the step of, if said most recently stored datum is greater than said previously stored datum, detecting when the number of occurrences of the last-mentioned condition reaches a predetermined number to verify that said operated key has been turned off.

* * * * *